United States Patent [19]

Quan

[11] Patent Number: 4,458,213

[45] Date of Patent: Jul. 3, 1984

[54] CONSTANT QUIESCENT CURRENT, CLASS AB AMPLIFIER OUTPUT STAGE

[75] Inventor: Ronald Quan, Cupertino, Calif.

[73] Assignee: Sony Corporation, Tokyo, Japan

[21] Appl. No.: 449,133

[22] Filed: Dec. 13, 1982

[51] Int. Cl.³ ............................................. H03F 3/30
[52] U.S. Cl. .................................. 330/267; 330/265; 330/296
[58] Field of Search ............... 330/265, 267, 268, 270, 330/273, 274, 290, 296

[56] References Cited

U.S. PATENT DOCUMENTS 4,306,109 12/1981 Kondov .......................... 330/274 X Primary Examiner—James B. Mullins
Assistant Examiner—Steven J. Mottola
Attorney, Agent, or Firm—Philip M. Shaw, Jr.

[57] ABSTRACT

A circuit maintains the quiescent collector current of an output transistor amplifier constant by sensing the voltage developed across a resistor connected in series with the output transistor's collector and, using a differential amplifier, produces a first signal representative thereof which is sampled and held by a circuit controlled by a zero voltage crossing detector sensitive to the amplifier output voltage. The sampled and held signal is inverted and integrated with respect to an adjustable reference voltage to produce a second signal. The second signal controls the current passed by a transistor connected in a voltage divider network supplying the base bias voltage to the output transistor.

3 Claims, 1 Drawing Figure

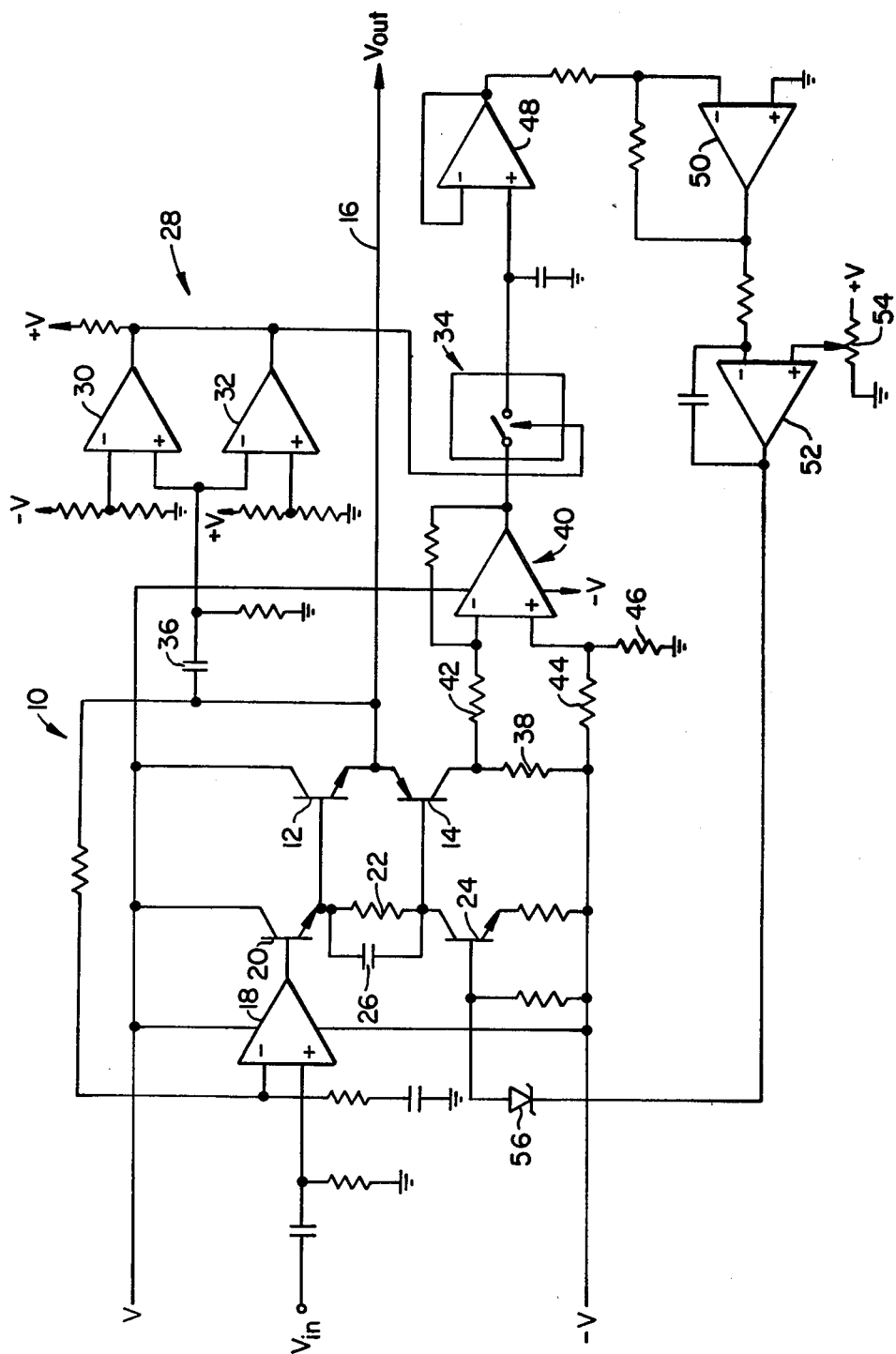

CONSTANT QUIESCENT CURRENT, CLASS AB AMPLIFIER OUTPUT STAGE

DESCRIPTION

1. Technical Field

This invention relates to amplifiers and drivers and more particularly to audio power amplifiers, video amplifiers, and servo motor drive amplifiers.

2. Background Art

In many class AB amplifiers, the quiescent output current is temperature dependent unless compensation diodes are provided. Other forms of control are to provide emitter degeneration resistors which have the disadvantage of increasing the output impedance of the stage.

What is needed in a way to stablize the output quiescent current in a manner which is independent from temperature, which does not require compensation diodes, and which does not increase the output impedance of the stage.

DISCLOSURE OF THE INVENTION

The above and other objects are achieved with the present invention of a means for controlling the quiescent collector current of the output stage transistors of an amplifier. This controlling means comprises differential amplifier means for sensing the output transistor's collector current and for producing a first signal which is proportional to such current. A zero crossing detector is supplied with the output signal of the output transistor and a sample and hold means, operating under the control of the zero crossing detector, samples and holds the first signal from the differential amplifier means whenever the output signal is at zero voltage.

The sampled and held first signal, which is proportional to the collector current, is then supplied to an inverter/integrater means for inverting the sampled and held first signal and for producing an integrated, second signal which is representative of the difference between the sampled and held first signal and a reference signal. Bias control means is supplied with this second signal and uses it to produce a bias voltage to the output transistor in response to the second signal so as to maintain a constant quiescent collector current.

In the preferred embodiment of the invention, the bias control means comprises a voltage divider circuit including a resistor and a first transistor having its collector and emitter leads connected in series with said resistor. The base lead of the first transistor is supplied with the second signal and the base lead of the output transistor is supplied with the bias voltage developed across said resistor.

It is therefore an object of the present invention to provide a transistor output stage for an amplifier having a constant quiescent collector current irrespective of operating temperature.

It is yet another object of the invention to provide an amplifier having a constant quiescent collector current in the output transistor stage without increasing the impedance of the stage.

The novel features which are believed to be characteristic of the invention, both as to organization and method of operation, together with further advantages thereof, will be better understood from the following drawing, in which several preferred embodiments of the invention are illustrated by way of example.

BRIEF DESCRIPTION OF THE DRAWING

The FIGURE is a schematic diagram of a constant quiescent current, class AB transistor amplifier output stage according to the invention.

BEST MODE FOR CARRYING OUT THE INVENTION

Referring now more particularly to the FIGURE, a class AB power amplifier 10 has a pair of output transistors 12 and 14 connected in push-pull fashion to an output terminal 16. The first input stage of the amplifier 10 is the differential amplifier 18 whose output drives a single NPN transistor 20 connected in an emitter-follower configuration. The base of the NPN transistor 12 is connected to the emitter of the transistor 20 and through a resistor 22 to the collector of an NPN transistor 24. A bypass capacitor 26 is connected in parallel with the resistor 22.

A zero voltage crossing detector 28 is connected to the output terminal 16. The zero crossing detector 28 is comprised of a pair of differential amplifiers 30 and 32 which have their outputs connected together to the control input of a sample and hold circuit 34. The inverting input of the amplifier 30 is provided with a minus bias voltage. The non-inverting input of the amplifier 32 is provided with a plus bias voltage. The remaining non-inverting input of the amplifier 30 and the inverting input of the amplifier 32 are connected together and through a capacitor 36 to the output terminal 16. As is well understood by those skilled in the art, whenever the output voltage at output terminal 16 passes through zero, a control signal is generated by the circuit 28 to operate the hold switch 34, shown diagrammatically in a mechanical form, although it is to be understood that the switch 34 is electronic.

The collector of the transistor 14 is connected in series with a resistor 38 to a minus voltage supply line. The inverting input of a differential amplifier 40 is connected through a resistor 42 to the collector of transistor 14. The non-inverting input of the amplifier 40 is connected through a resistor 44 to the minus voltage source and the resistor 38. The voltage developed across the resistor 38 as a result of the collecter current is supplied as an input to the differential amplifier 40. The non-inverting input of the amplifier 40 is also connected to the circuit ground through a resistor 46. The voltage across the resistor 38 is converted by the differential amplifier 40 to a first voltage signal which is referenced to ground.

This first voltage signal from the differential amplifier 40 is the signal which is sampled and held by the circuit 34. The output of the circuit 34 is provided to the non-inverting input of a differential amplifier 48 connected as a buffer. The output of the buffer amplifier 48 is connected to the inverting input of a differential amplifier 50 connected as an inverter. The inverted, sampled and held signal is then supplied to the inverting input of a differential amplifier 52 connected as an integrator. The non-inverting input of the amplifier 52 is provided with a controllable reference voltage by means of a potentiometer 54. The output of the integrator 52 is the integrated, inverted, sampled and held first signal. This second signal is supplied to the base lead of the NPN transistor 24 through a Zener diode 56 whose anode is connected to the base of the transistor 24 and whose cathode is connected to the output of the integrating amplifier 52.

By integrating the sampled and held first signal voltage, the response time for controlling the collector current of the output stage does not oscillate. It will be appreciated that the bias voltage supplied to the base input of the transistor 24 will control the collector current flowing through that transistor which, in turn, through the resistor 22 will control the base biases to the transistors 12 and 14. In this way, the collector current of the transistors 12 and 14 is directly proportional to the output of the integrating amplifier 52.

Since the voltage at the inverting input must equal the voltage of the non-inverting input of the integrator 52, the output of the integrator 52 can be controlled by the reference voltage setting on potentiometer 54 and thus the output collector current of the transistors 12 and 14 can be set by the adjustment of potentiometer 54.

The purpose of the Zener diode 56 is to keep the transistors 12 and 14 from experiencing excessive current during start-up of the power supplies for the amplifiers.

The terms and expressions which have been employed here are used as terms of description and not of limitation and there is no intention, in the use of such terms and expressions, of excluding equivalents of the features shown and described, or portions thereof, it being recognized that various modifications are possible within the scope of the invention as claimed.

I claim:

1. In combination with a transistor amplifier for receiving an input signal and producing a corresponding, amplified, output signal and having at least one output transistor, means for controlling the quiescent collector current of the output transistor, comprising differential amplifier means for sensing the output transistor's collector current and for producing a first signal proportional thereto, zero-crossing detector means supplied with the output signal, a sample and hold means supplied with the first signal and controlled by the zero-crossing detector means to sample and hold the first signal whenever the output signal is at zero voltage, means for supplying a reference signal, inverter/integrator means for inverting the sampled and held first signal and for producing a second signal which is representative of the integrated difference between the sampled and held first signal and the reference signal, and bias control means supplied with the second signal for supplying a bias voltage to the output transistor in response to the second signal whereby the quiescent collector current is maintained constant.

2. The combination as recited in claim 1 wherein the amplifier comprises a pair of output transistors in push-pull configuration.

3. The combination as recited in claim 1 wherein the bias control means comprises a voltage divider means including a resistor and a transistor having its collector and emitter leads connected in series with said resistor, and wherein the base lead of said transistor is supplied with said second signal.

* * * * *